United States Patent
Bevan et al.

[11] Patent Number: 5,838,053
[45] Date of Patent: Nov. 17, 1998

[54] METHOD OF FORMING A CADMIUM TELLURIDE/SILICON STRUCTURE

[75] Inventors: Malcolm J. Bevan; Hung-Dah Shih, both of Garland, Tex.

[73] Assignee: Raytheon TI Systems, Inc., Lewisville, Tex.

[21] Appl. No.: 724,267

[22] Filed: Sep. 19, 1996

[51] Int. Cl.$^6$ .................. H01L 31/00; H01L 31/0328; H01L 31/0336; H01L 31/072
[52] U.S. Cl. ............................ 257/442; 257/190
[58] Field of Search ..................... 257/442, 190

[56] References Cited

U.S. PATENT DOCUMENTS

| | | | |
|---|---|---|---|
| 4,686,373 | 8/1987 | Tew et al. | 250/578 |
| 4,910,154 | 3/1990 | Zanio et al. . | |
| 4,914,053 | 4/1990 | Matyi et al. | 437/90 |
| 4,994,867 | 2/1991 | Biegelsen . | |
| 5,300,777 | 4/1994 | Goodwin | 250/338.4 |
| 5,374,841 | 12/1994 | Goodwin | 257/442 |
| 5,449,927 | 9/1995 | Hamilton, Jr. et al. . | |
| 5,581,117 | 12/1996 | Kawano . | |

FOREIGN PATENT DOCUMENTS 2291177  11/1990  Japan .

OTHER PUBLICATIONS de Lyon et al., "Direct molecular–beam epitaxial growth of ZnTe(100) and CdZnTe(100)/ZnTe(100) on Si(100) substrates", Applied Physics Lett., vol. 63, No. 6, Aug. 9, 1993, pp. 818–820.

Sporken et al., "Molecular beam epitaxial growth of CdTe and HgCdTe on Si(100)", Applied Physics Lett., vol. 55 (18), Oct. 30, 1989, pp. 1879–1881.

*Primary Examiner*—Stephen Meier
*Attorney, Agent, or Firm*—Baker & Botts, L.L.P.

[57] ABSTRACT

In one embodiment, a semiconductor structure is disclosed. The structure includes both a silicon and a cadmium telluride layer. Each may have a (100) lattice orientation. A plurality of buffer layers are disposed between the silicon layer and the cadmium telluride layer. Each of these buffer layers has a lattice constant which is greater than the lattice constant of the layer below it and less than the lattice constant of the layer above it. As examples, these buffer layers may comprise zinc sulfide, zinc selenide, zinc telluride or zinc tellurium selenide.

11 Claims, 1 Drawing Sheet

METHOD OF FORMING A CADMIUM TELLURIDE/SILICON STRUCTURE

FIELD OF THE INVENTION

This invention generally relates to the fabrication of semiconductor devices and specifically to a method of forming a cadmium telluride on silicon structure.

BACKGROUND OF THE INVENTION

A number of semiconductor applications require the formation of a cadmium telluride (CdTe) layer over a silicon (Si) substrate. For example, a larger CdTe substrate can be formed in this manner. While silicon can be formed in substrates of eight to twelve inch diameters or more, CdTe substrates are typically sized at about 4 cm×6 cm. Therefore, an increase of more than thirteen times can be achieved if the CdTe can be grown on an eight-inch silicon wafer.

Another application which requires cadmium telluride layers formed on silicon substrates is found in infrared detectors. Cryogenic infrared detectors are typically made of small band gap (about 0.1–0.2 eV) semiconductors such as HgCdTe (mercury cadmium telluride) grown on CdTe (with approx. 4% ZnTe added for lattice matching to HgCdTe) substrates and operate as photodiodes or photoconductors by photo absorption to produce electron-hole pairs. For example, U.S. Pat. No. 4,686,373 describes a hybrid system with HgCdTe photoconductors bonded to silicon signal processing circuitry.

A problem arises because of the huge thermal mismatch between the silicon and the mercury cadmium telluride. One way to overcome this thermal mismatch problem is to provide a second silicon layer formed on the other side of the HgCdTe substrate so that the HgCdTe is sandwiched between the two silicon layers. In this manner, the thermal mismatches will cancel.

One way to form this layer is to epitaxially grow cadmium telluride (CdTe) on a silicon wafer. For example, R Sporken et al., Molecular beam epitaxial growth of CdTe and HgCdTe on Si (100), Appl. Phys. Lett. 55(18) (1989), p. 1879, teaches a method of forming a CdTe layer on a silicon substrate. A HgCdTe layer can then be grown upon the CdTe layer by molecular beam epitaxy (MBE), metalorganic chemical vapor deposition (MOCVD), or liquid phase epitaxy (LPE).

However, a problem exists because of the lattice mismatch and crystal structure between the cadmium telluride and the silicon. For example, direct growth of cadmium telluride on silicon (100) using MBE or MOCVD gives cadmium telluride (111) on silicon (100) leading to a non-parallel epitaxy. This non-parallel epitaxy is undesirable and therefore a method of growing cadmium telluride (100) upon silicon is presently desired, that can be applied to other orientations such as (211) to maintain parallel epitaxy.

Other techniques have utilized ZnTe as a buffer layer between Si and CdZnTe. See e.g., T. J. de Lyon et al., Direct molecular-beam epitaxial growth of ZnTe (100) and CdZnTe (100)/ZnTe (100) on Si (100) substrates, Appl. Phys. Lett., 63 (Aug. 9, 1993), p. 818. In this case, single-crystal CdZnTe (100) films were grown on Si with the use of ZnTe buffer layers.

SUMMARY OF THE INVENTION

A method of solving the problems of the prior art will in part appear hereinafter and will be accomplished by the present invention which provides a method for forming a cadmium telluride layer on a silicon substrate.

In one embodiment, a semiconductor structure is disclosed. The structure includes both a silicon and a cadmium telluride layer. Each may have a (100) lattice orientation. A plurality of buffer layers are disposed between the silicon layer and the cadmium telluride layer. Each of these buffer layers has a lattice constant which is greater than the lattice constant of the layer below it and less than the lattice constant of the layer above it. As examples, these buffer layers may include combinations of zinc sulfide, zinc selenide, zinc telluride or zinc tellurium selenide.

A method of forming a cadmium telluride layer on a silicon layer is also disclosed herein. A silicon layer (e.g., a substrate) is provided and may have a nominal (100) lattice orientation. A first buffer layer, such as zinc selenide, is formed over the silicon layer, and then a second buffer, layer such as zinc telluride, is formed over the first buffer layer. A cadmium telluride layer is then formed over the second buffer layer. The first and second buffer layers are chosen such that the lattice constant of the buffer layer will be in between that of the two adjacent layers. Additional two buffer layers may also be included.

An advantage of the present invention is that it provides a simple way of forming a cadmium telluride layer upon a silicon layer creating parallel epitaxy. The large mismatch between cadmium telluride and silicon (which is about 19 percent) can be avoided by using intervening layers which have a mismatch on the order of about only 4 percent. This gradual change in mismatch will allow the desired orientation to be formed and provide a high crystal quality.

Another advantage of the preferred embodiment of the present invention is that it provides a series of buffer layers which are of the same growth system. For example, zinc selenide, zinc telluride and zinc sulfide are all II–VI semiconductors and therefore will have higher crystal quality and can be deposited in the same growth chamber without exposing interfaces to air.

The specific embodiment of using zinc selenide provides another advantage. The growth temperature of zinc selenide on silicon is about 450° C., or about 150° C. higher than that of cadmium telluride on silicon. Thus, it takes less time to cool a silicon substrate from the about 950° C. (for oxide desorption) to 450° C. in zinc selenide/silicon then from 950° C. to 300° C. in cadmium telluride/silicon. As a result, the silicon substrate will not be subjected to prolonged exposure to background impurities for the case of zinc selenide/silicon.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated. It is noted that none of the figures are drawn to scale.

DETAILED DESCRIPTION OF ILLUSTRATIVE EMBODIMENTS

The making and use of various embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not limit the scope of the invention.

Figure 1:
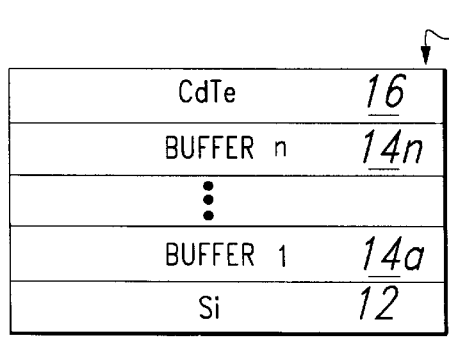
FIG. 1 is a cross sectional view of a first embodiment layered structure.

Referring first to FIG. 1, a semiconductor structure 10 of the present invention is illustrated in simplified form. (The Figures are not drawn to scale.) A silicon layer 12 is provided. The silicon layer 12 may preferably comprise a silicon substrate and may have a nominal (100) lattice orientation. A typical wafer may be misoriented 2° off (100). Other wafers may be misoriented by 4° or more.

A number of buffer layers 14a–14n are disposed upon silicon layer 12. In the preferred embodiment, two buffer layers are used. However, more or less than two would also suffice. A cadmium telluride layer 16 is formed over the last of the buffer layers 14.

The materials utilized for buffer layers 14a–14n are chosen so that they have a lattice constant which varies slightly from silicon to cadmium telluride. In other words, each of the buffer layers 14a–14n has a lattice constant which is greater than the lattice constant of the layer below it and is less than the lattice constant of the layer above it. For example, the buffer layer 14a would have a lattice constant between the lattice constant of silicon layer 12 and buffer layer 14n. Similarly, buffer layer 14n will have a lattice constant between buffer layer 14a and cadmium telluride layer 16.

Figure 4:
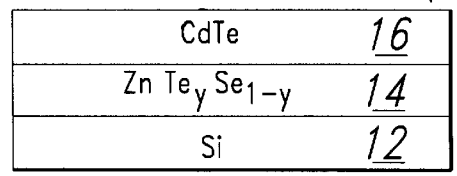
FIGS. 2–4 are cross sectional views of more specific embodiments.
Figure 2:
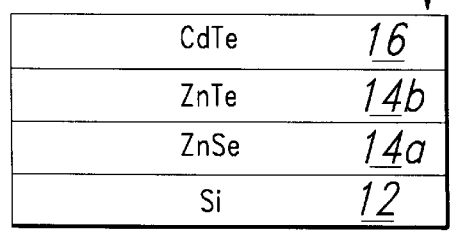
Figure 3:
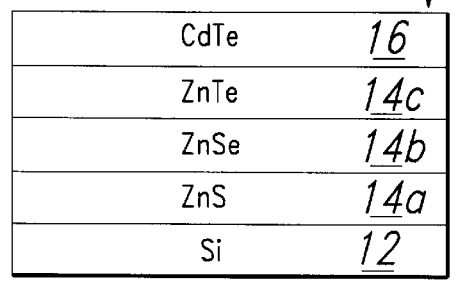

Therefore, in general, the solution is to circumvent the nonparallel epitaxy problem by inserting at least one buffer layer 14 between cadmium telluride layer 16 and silicon layer 12. This buffer layer should have a lattice constant smaller than that of cadmium telluride but larger than that of silicon. FIGS. 2–4 illustrate three exemplary embodiments of structures which meet this general criteria.

Referring now to FIG. 2, zinc selenide (ZnSe) and zinc telluride (ZnTe) can be used as buffer layers 14a and 14b, respectively. In this embodiment, a zinc selenide layer 14a is disposed upon silicon layer 12. The ZnSe layer 14a is typically between about 0.1 and 2 microns thick and preferably about 1 micron thick. A zinc telluride layer 14b is disposed upon the zinc selenide layer 14a. The ZnTe layer 14b is typically between about 0.1 and 2 microns thick and preferably about 1 micron thick. The ZnSe layer 14a and ZnTe layer 14b may be the same thickness but do not need to be. Cadmium telluride layer 16 typically greater than 4 microns, may be formed upon zinc telluride layer 14b. The choice of these materials provides a graded lattice parameter transition from the silicon to the cadmium telluride.

The sequence of materials will incrementally increase the lattice constant from that of silicon to that of cadmium telluride and will preserve the orientation all the way to cadmium telluride. In fact, we have recently experimentally grown zinc selenide on silicon (100) using MOCVD. The zinc selenide epilayers were indeed of (100) orientation.

In an alternative embodiment, illustrated in FIG. 3, a zinc sulfide (ZnS) layer 14a is disposed over silicon layer 12. The zinc sulfide layer 14a is typically between about 0.1 and 2 microns thick and preferably about 1 micron thick. In the illustrated embodiment, both a ZnSe layer 14b and a ZnTe layer 14c are also included although only one or the other could be used. In other embodiments, other materials may be used instead.

For example, the binary compounds (e.g., ZnSe) could be replaced with ternaries (e.g., ZnSSe) or quaternaries (e.g., ZnSSeTe) as miscible over whole composition ranges. However, it is easier to control growth of binaries than ternaries or quaternaries.

FIG. 4 illustrates yet another embodiment. In this example, the buffer layers 14 comprise a plurality of $ZnTe_ySe_{1-y}$ layers where y varies between adjacent layers. For example, y may be equal to about 0.0 (i.e., ZnSe) near the interface between buffer layer 14 and silicon layer 12 and gradually increase to 1.0 (i.e., ZnTe) near the interface between buffer layer 14 and cadmium telluride layer 16. This embodiment provides a continuous grading between the silicon layer 12 and cadmium telluride layer 16 over the thickness of the film that is typically between 1–4 microns. The grading can alternatively be achieved by a finite number of steps, e.g., between about 5 and 15 steps, preferably about 10 steps, with increasing ZnTe content by continually increasing Te content of film and decreasing Se.

In any of these embodiments, a mercury cadmium telluride (HgCdTe) layer (see elements 18a–18b in FIGS. 5–7) may be disposed over the CdTe layer 16. In this case, approximately four percent ZnTe may be added to CdTe such that it is lattice matched to HgCdTe ($\chi=0.2$). For example, an n-type layer 18b and p-type layer 18a may be used to create an array of photodiodes in an infrared sensor. Further description of possible detector embodiments will be discussed below. However, first a description of the processing details for performing the present invention will be provided.

In the preferred embodiment, a silicon substrate 12 is placed into a MOCVD machine in a substrate holder preferably utilizing indium free mounting. After outgassing and oxide desorption, a zinc selenide buffer epilayer is grown at the substrate temperature of between about 450° and 550° C. (preferably about 500° C.) and a growth rate of between about 0.1 and 1.0 $\mu$m/hr (preferably about 0.15 $\mu$m/hr) to a thickness of between about 0.1 and 2 (preferably about 1 $\mu$m) using Diethyl Selenide (DESe) and Diethyl Zinc (DEZn). The DESe/DEZn ratio may range from about 2 to 10 and is preferably about 5. Other precursors such as diisopropyl selenide and dimethyl zinc can also be used.

During this process, the reactor pressure is typically be between about 40 and 300 torr and preferably about 40 torr. Dimethyl cadmium (DMCd) and Diisopropyl telluride (DiPTe) can be used to grow a CdTe layer at a rate of between about 1 and 4 micron/hr (preferably about 2 micron/hr). Other precursors such as diethyl cadmium and diethyl telluride can also be used. The ratio of DIPTe to DMCd varies from about 1 to 6. The reactor pressure will typically be between about 80 and 300 Torr and preferably about 150 Torr. The final layer can be grown to between about 0.2 and 8 microns and typically about 4 microns.

A wide variety of Zn, Se, Te precursors exist that will allow ZnSe and ZnTe to be grown at temperatures in the 400°–550° C. range. For example, ZnSe can be grown with diethyl zinc and diethyl selenide while ZnTe can be grown with diethyl zinc and diethyl or dimethyl telluride. To obtain a graded ZnSe/ZnTe structure, ZnSe can be grown initially. To get the graded structure, the Se flow can be progressively reduced as the Te flow is increased. Alternatively, a number of discrete layers (e.g., between about 5 and 15 layers, each between about 0.1 and 0.5 microns thick) can be grown with increasing Te content and decreasing Se content per layer.

Figure 5:
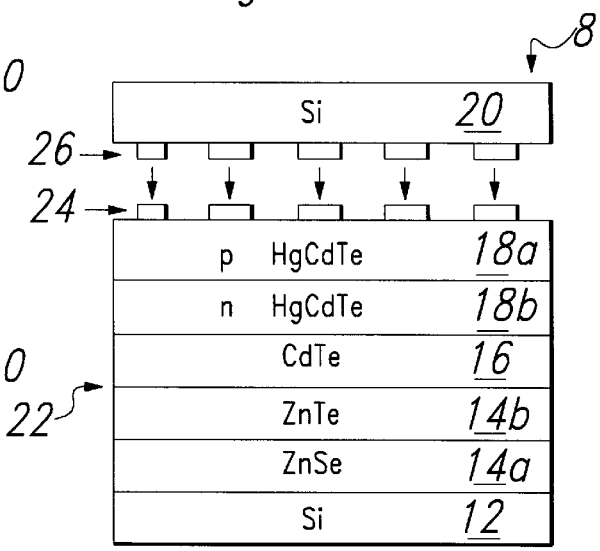
FIGS. 5–7 are cross sectional views of infrared detectors which utilize the structure of present invention.
Figure 6:
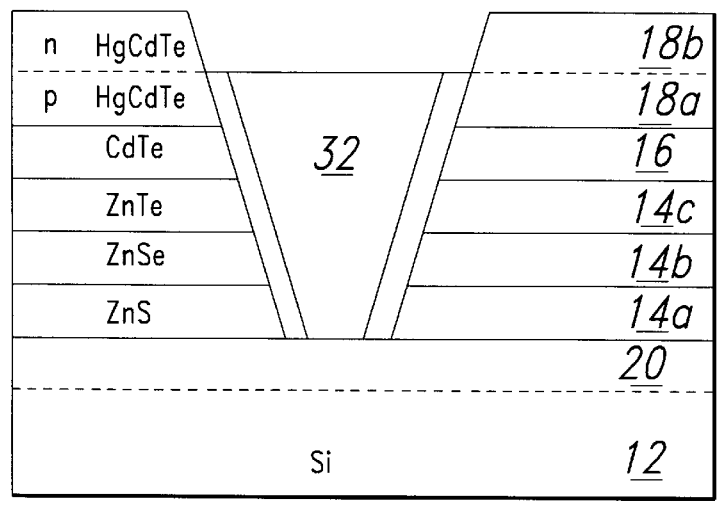
Figure 7:
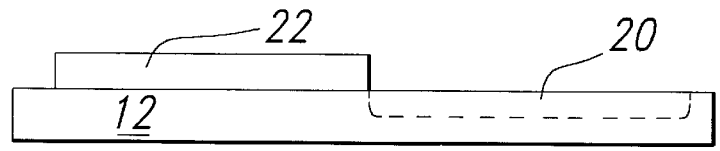

As an example of one of the possible applications of the present invention, an exemplary array of infrared detectors 8 is illustrated in FIG. 5. Other embodiments of infrared detectors are also illustrated in FIGS. 6 and 7. It is noted that no attempt has been made to depict the thickness of the layers to scale.

Referring now to FIG. 5, detector array 8 typically comprises two fabricated components which are bonded together. The first component 22 includes the infrared array 24. Typically, the array includes the photodiode pixels (not explicitly illustrated) which may be formed in rows and columns. These photodiodes are formed from the p-type HgCdTe layer 18a and n-type HgCdTe layer 18b. A conductive contact 24 is formed corresponding to each of the pixels. A typical infrared array 24 of this type is illustrated in U.S. Pat. No. 5,300,777, incorporated herein by reference.

The second portion of the detector array 8 includes semiconductor (e.g., silicon) integrated circuitry denoted generally by reference numeral 20. The detector circuitry (not explicitly shown) included in the semiconductor layer 20 may be as simple as only one address switch per matrix cell or can be expanded to also include features such as high gain preamplifiers, low pass noise filters, buffers, address switches, and other components. In general, a portion of the detection circuitry 20 will correspond to each pixel.

Conductive contacts 26 are also formed on the surface of semiconductor layer 20. The contacts 26 will electrically connect each pixel in p-type HgCdTe layer 18a to its corresponding portion of the detection circuitry in integrated circuitry 20 via conductive contacts 24.

The preferred embodiment process for attaching the processing substrate 20 to the detector array 22 is bump bonding, which is well known in the art. In general, regions of metal such as indium are formed on the contacts 24 and 26 and the two portions are physically pressed together (and possibly heated) to form a stable mechanical bond. It is also noted that air gaps separate the individual pixels from one another to provide increased thermal isolation.

In operation, the infrared detector will be "back-side illuminated." In other words, radiation will impinge on the detector by transmitting through silicon layer 12, buffer layers 14a–14b and cadmium telluride layer 16 before reaching the photodiodes formed in HgCdTe layers 18a and 18b.

An alternative embodiment infrared detector is illustrated in FIG. 6. This figure shows a single photodiode 30. In this "n-on-p" embodiment, radiation will impinge upon the detector by impinging upon n-type HgCdTe layer 18b. The p-side of the photodiode 30 is coupled to the processing circuitry 20 via a contact 32 disposed in a via which was formed throughout each of layers above substrate 12. The contact 32 performs an analogous function of contacts 24 and 26 of the embodiment of FIG. 5.

It is noted that the embodiment of FIG. 5 illustrates a buffering scheme which includes ZnSe layer 14a and ZnTe layer 14b while the embodiment of FIG. 6 illustrates a buffering scheme which includes ZnS layer 14a, ZnSe layer 14b and ZnTe layer 14c. These choices are purely arbitrary. Any buffering scheme 14 as described herein can be used with either embodiment detector. In other words, the design of detectors is not limited to the specific embodiments illustrated.

FIG. 7 illustrates a simplified view of a "smart focal plane array". In this embodiment, the detector array 22 (which includes the HgCdTe, CdTe and buffer layers) is formed over a portion of silicon substrate 12. The processing circuitry 20 is then formed in another portion of the substrate 12. The structure of FIG. 7 can be fabricated using the processes described above where a mask (not shown) is provided over the portions of substrate 12 which will not have detector array 22 formed thereon.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor structure comprising:

a silicon layer having a first lattice constant;

a zinc sulfide layer disposed on said silicon layer and having a second lattice constant which is greater than said first lattice constant;

a cadmium telluride layer having a third lattice constant; and a plurality of buffer layers formed between said zinc sulfide layer and said cadmium telluride layer, each of said buffer layers having a lattice constant which is greater than a lattice constant of the layer below it and which is less than a lattice constant of the layer above it.

2. The structure of claim 1 wherein at least one of said buffer layers is a zinc selenide layer.

3. The structure of claim 1 wherein at least one of said buffer layers is a zinc telluride layer.

4. The structure of claim 1 wherein said silicon layer and said cadmium telluride layer each have a (100) lattice orientation.

5. The structure of claim 1 wherein said buffer layers include a plurality of zinc telluride selenide layers each with a formula $ZnTe_ySe_{1-y}$ wherein y varies between adjacent layers.

6. The structure of claim 5 wherein said plurality of zinc telluride selenide layers are a plurality of discrete layers.

7. The structure of claim 1, wherein said buffer layers include a zinc telluride selenide layer which is continuously graded from zinc telluride to zinc selenide in a direction toward said silicon layer.

8. The structure of claim 1 wherein said buffer layers include a zinc selenide layer, and a zinc telluride layer disposed over said zinc selenide layer.

9. The structure of claim 8 wherein said zinc sulfide layer is adjacent said zinc selenide layer.

10. The structure of claim 1 including a mercury cadmium telluride layer disposed over said cadmium telluride layer.

11. The structure of claim 1 wherein said cadmium telluride layer is disposed over only a portion of said silicon layer.

* * * * *